（12） United States Patent
Cheng et al.

(10) Patent No.: US 9,059,217 B2
(45) Date of Patent: Jun. 16, 2015

(54) FET SEMICONDUCTOR DEVICE WITH LOW RESISTANCE AND ENHANCED METAL FILL

(71) Applicant: International Business Machines Corporation, Armonk, NY (US)

(72) Inventors: Kangguo Cheng, Schenectady, NY (US); Junli Wang, Slingerlands, NY (US); Keith Kwong Hon Wong, Wappingers Falls, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/852,086

(22) Filed: Mar. 28, 2013

(65) Prior Publication Data

US 2014/0291760 A1   Oct. 2, 2014

(51) Int. Cl.
  *H01L 21/84* (2006.01)
  *H01L 29/66* (2006.01)
  *H01L 29/78* (2006.01)
  *H01L 27/12* (2006.01)

(52) U.S. Cl.
  CPC .......... *H01L 29/6681* (2013.01); *H01L 29/785* (2013.01); *H01L 27/1211* (2013.01)

(58) Field of Classification Search
  None
  See application file for complete search history.

(56) References Cited

U.S. PATENT DOCUMENTS

| | | | |
|---|---|---|---|
| 6,855,989 B1 | 2/2005 | Wang et al. | |
| 6,864,540 B1 | 3/2005 | Divakaruni et al. | |
| 7,129,550 B2 * | 10/2006 | Fujiwara et al. | 257/401 |
| 7,271,455 B2 | 9/2007 | Cabral, Jr. et al. | |
| 7,531,437 B2 | 5/2009 | Brask et al. | |
| 7,569,443 B2 | 8/2009 | Kavalieros et al. | |
| 7,659,157 B2 | 2/2010 | Greene et al. | |
| 7,714,393 B2 * | 5/2010 | Tai et al. | 257/369 |
| 7,867,863 B2 | 1/2011 | Chang | |
| 8,022,488 B2 | 9/2011 | Cheng et al. | |
| 8,039,966 B2 | 10/2011 | Yang et al. | |
| 8,134,209 B2 | 3/2012 | Yagishita et al. | |
| 2007/0120199 A1 | 5/2007 | Pan et al. | |
| 2008/0200019 A9 * | 8/2008 | Huotari et al. | 438/585 |
| 2011/0037125 A1 | 2/2011 | Cheng et al. | |
| 2011/0147831 A1 * | 6/2011 | Steigerwald et al. | 257/330 |
| 2011/0169085 A1 | 7/2011 | Xu et al. | |

(Continued)

OTHER PUBLICATIONS

U.S. Appl. No. 13/690,867, entitled "Semiconductor Device With Raised Source/Drain and Replacement Metal Gate" filed Nov. 30, 2012.
Kuhn, "CMOS Transistor Scaling Past 32nm and Implications on Variation", 978-1-4244-6519-7/10, © 2010 IEEE, pp. 214-246, ASMC 2010.
Yang et al., "In Situ Co/SiC(N,H) Capping Layers for Cu/Low-k Interconnects", IEEE Electron Device Letters, vol. 33, No. 4, Apr. 2012, 0741-3106/, © 2012 IEEE, pp. 588-590.

(Continued)

*Primary Examiner* — Evan Pert
*Assistant Examiner* — Herve Assouman
(74) *Attorney, Agent, or Firm* — Isaac J. Gooshaw

(57) ABSTRACT

In a method of fabricating a FET semiconductor device, a FET structure with a gate channel and dummy gate is formed on a layer of substrate. The gate channel includes one or more FINs, and spacer layers that line the sides of the gate channel and abut the layer of substrate. The dummy gate is removed and the height of the gate channel is reduced to substantially near that of a top surface of one or more FINs. A layer of high-k material is deposited into the gate channel. A layer of first metal is then deposited that fills the gate channel and covers, at least in part, the layer of high-k material. Excess material is removed from the layers of high-k material and first metal to create a surface. A layer of second metal is selectively deposited onto the surface to form a continued gate conductor.

15 Claims, 6 Drawing Sheets

(56) References Cited

U.S. PATENT DOCUMENTS

2011/0183508 A1 7/2011 Chan et al.
2011/0195557 A1 8/2011 Teo et al.
2011/0227157 A1 9/2011 Yang et al.
2011/0248348 A1 10/2011 Gan et al.
2012/0211808 A1* 8/2012 Wei et al. .................. 257/288

OTHER PUBLICATIONS

Yang et al., "Selective Chemical Vapor Deposition-Grown Ru for Cu Interconnect Capping Applications", doi: 10.1149/1.3339450, Electrochem. Solid-State Lett. 2010 vol. 13, issue 5, D33-D35, pp. 1-2, Published Mar. 10, 2010, © 2010 ECS—The Electrochemical Society, <http://intl.esl.ecsdl.org/content/13/5/D33.abstract>.

* cited by examiner

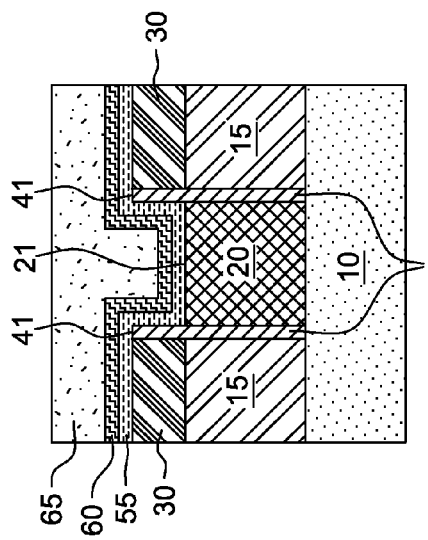
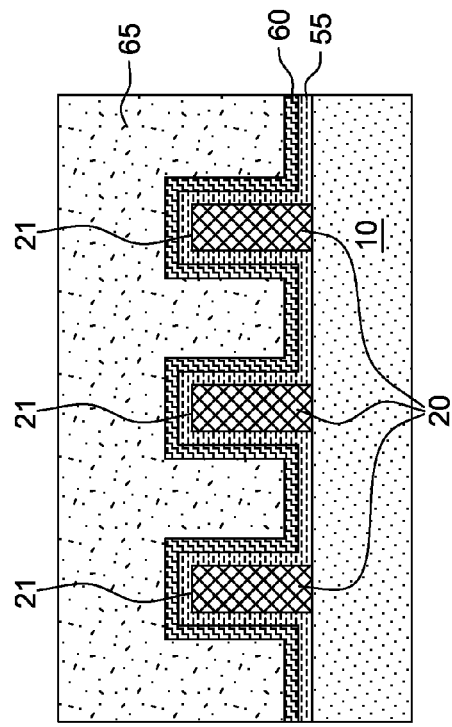
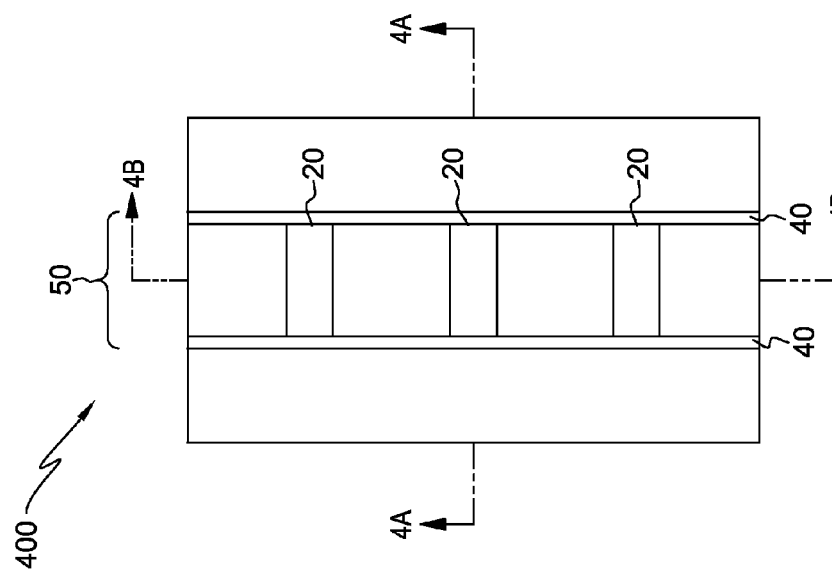

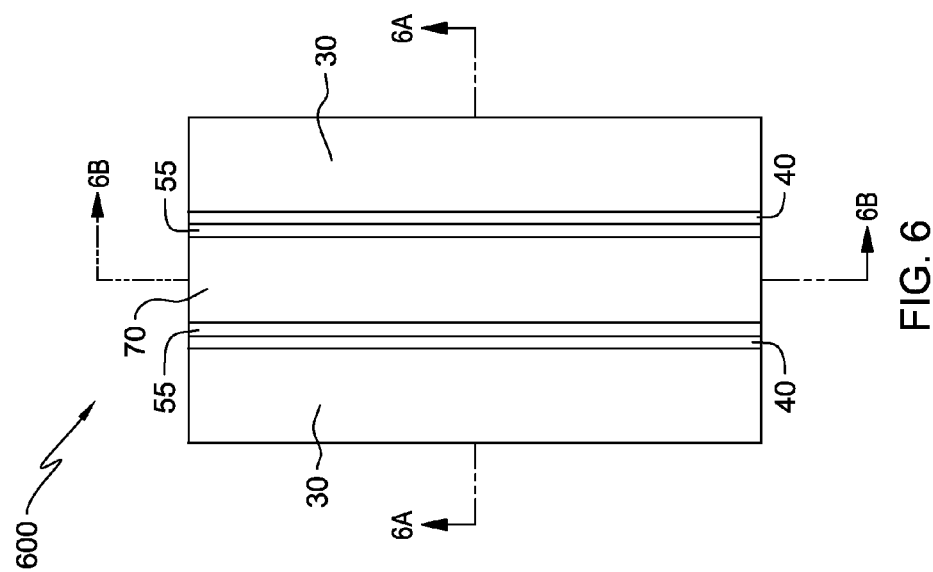
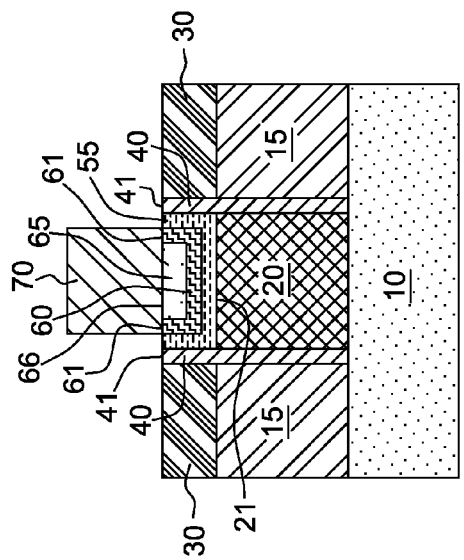
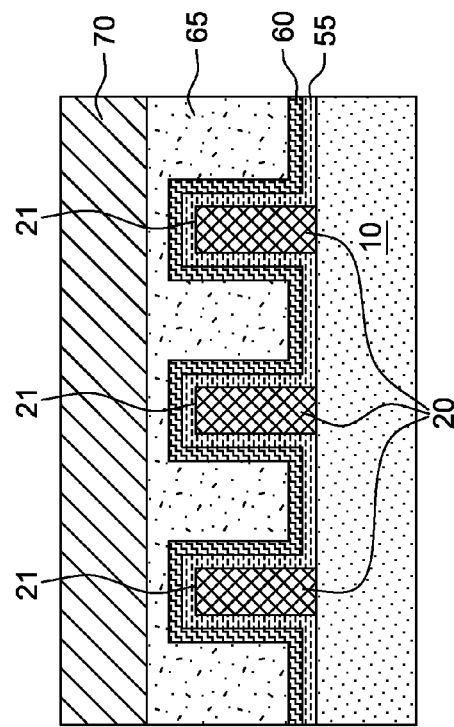

FET SEMICONDUCTOR DEVICE WITH LOW RESISTANCE AND ENHANCED METAL FILL

FIELD OF THE INVENTION

The present invention relates generally to the field of semiconductor devices, and more particularly to highly scaled finFET devices.

BACKGROUND OF THE INVENTION

A metal oxide semiconductor field-effect transistor (MOSFET) has been the building block for most computing devices for the last several decades. A MOSFET is a four terminal device made up of a drain, a source, a gate and a bulk substrate. In digital circuits, the MOSFET is essentially used as a switch. The source and drain are two ends of the switch, with the channel being turned on and off under the control of the gate. The gate controls the conductivity through the channel through an electric field and is insulated from the channel by a thin layer of dielectric material, such as silicon dioxide. With no voltage potential across the gate and bulk, a depletion region forms around the drain and source blocking any current flow.

The MOSFET has been the primary building block of integrated circuits for more than forty years. The advances in electronics have been driven primarily by the ability to scale down the size of the MOSFETs used in integrated circuits. This scaling achieves improvements on many fronts. Smaller transistors allow more transistors to be put on the same size chip, which has allowed integrations levels to rise from the hundreds of transistors to hundreds of millions of transistors.

Shrinking the feature size of the transistor also makes each transistor work faster and consume less power (this should not be confused with lower chip power, since the number of transistors per chip generally increases faster than power consumption per transistor decreases). The increase in speed comes from two factors, decreased capacitance and increased current. The capacitance of wires and gates decreases as the wire and gate elements decrease in size, thus, the amount of charge a transistor has to place on a wire or gate decreases.

A multi-gate device or multiple gate field-effect transistor (MuGFET) refers to a MOSFET that incorporates more than one gate into a single device. The multiple gates may be controlled by a single gate electrode, wherein the multiple gate surfaces act electrically as a single gate, or by independent gate electrodes. A multi-gate device employing independent gate electrodes is sometimes called a Multiple Independent Gate Field Effect Transistor (MIGFET). Multi-gate transistors are one of several strategies being developed by Complementary metal-oxide-semiconductor (CMOS) semiconductor manufacturers to create ever-smaller microprocessors and memory cells.

SUMMARY

The present invention provides a FET semiconductor device with low resistance and enhanced metal fill. A FET device is formed on top of a layer of substrate. The FET device includes a gate channel that perpendicularly crosses over one or more FINs and is filled with a dummy gate material. The gate channel includes spacer layers that line, at least in part, sidewalls of the gate channel and abut the substrate to have a height from the substrate to a distal end of the spacer layers, wherein the gate channel has a height being the same as that of the spacer layers. The dummy gate is removed and the height of the gate channel is reduced to substantially near a top surface of the one or more FINs inside the gate channel. A layer of high-k material is deposited into the gate channel. A layer of first metal is then deposited into the gate channel covering, at least in part, the layer of high-k material. Excess material is removed from the layer of high-k material and the layer of first metal to create a surface having a height substantially same as that of the spacer layers. A layer of second metal is selectively deposited onto the surface to form a continued gate conductor.

BRIEF DESCRIPTION OF THE SEVERAL VIEWS OF THE DRAWINGS

FIG. 4 is a top plan view, illustrating a tri-gate finFET device post addition of layers of high-k dielectric, work function metal, and aluminum, in accordance with an exemplary embodiment of the present invention.

FIG. 4A is a cross sectional view, illustrating a tri-gate finFET device post addition of layers of high-k dielectric, work function metal, and aluminum, in accordance with an exemplary embodiment of the present invention.

FIG. 4B is a cross sectional view, illustrating a tri-gate finFET device post addition of layers of high-k dielectric, work function metal, and aluminum, in accordance with an exemplary embodiment of the present invention.

FIG. 6 is a top plan view, illustrating a tri-gate finFET device post selective metal growth of a layer of metal on top of the aluminum layer, in accordance with an exemplary embodiment of the present invention.

FIG. 6A is a cross sectional view, illustrating a tri-gate finFET device post selective metal growth of a layer of metal on top of the aluminum layer, in accordance with an exemplary embodiment of the present invention.

FIG. 6B is a cross sectional view, illustrating a tri-gate finFET device post selective metal growth of a layer of metal on top of the aluminum layer, in accordance with an exemplary embodiment of the present invention.

DETAILED DESCRIPTION

Figure 1A:
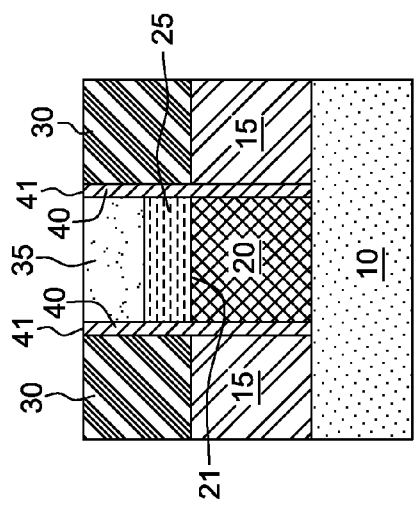
FIG. 1A is a cross sectional view, illustrating a tri-gate finFET device pre polycrystalline silicon removal, in accordance with an exemplary embodiment of the present invention.

Planar transistors have been the core of integrated circuits for several decades, during which the size of the individual transistors have steadily decreased. As the size decreased, planar transistors have increasingly suffered from an undesirable short-channel effect, namely the leakage (flow) of current through the transistor when the transistor is in an "off-state". The leakage of current increases the idle power required by the device, leading to reduced energy efficiency.

In a multi-gate device, such as a metal-oxide-semiconductor field-effect transistor (MOSFET), the channel is surrounded by several gates on multiple surfaces, allowing more effective suppression of "off-state" leakage current. Multiple gates also allow enhanced current in the "on" state, also known as drive current. These advantages translate to lower power consumption and enhanced device performance. Non-planar devices are also more compact than conventional planar transistors, enabling higher transistor density, which translates to smaller overall microelectronics.

A field-effect transistor (FET) is a transistor that uses an electric field to control the shape and hence the conductivity of a channel of one type of charge carrier, namely electrons or holes, in a semiconductor material. All FETs have source, drain, and gate terminals. The charge carriers flow from the source to the drain. Most FETs have a fourth terminal called the body, base, bulk, or substrate. This fourth terminal serves to bias the transistor into operation. In general, it is rare to make non-trivial use of the body terminal in circuit designs, since the body terminal can be important when setting up the physical layout of an integrated circuit.

The names of the terminals refer to their functions. The gate terminal may be thought of as controlling the opening and closing of a physical gate. The gate terminal permits charge carriers to flow through or blocks their passage by either creating or eliminating a channel between the source and drain. Electrons flow from the source terminal towards the drain terminal if influenced by an applied voltage. The body refers to the bulk of the semiconductor in which the gate, source and drain lie. Usually, the body terminal is connected to the highest or lowest voltage within the circuit, depending on circuit type. The body terminal and the source terminal are sometimes connected together since the source is also periodically connected to the highest or lowest voltage within the circuit. However there are several uses of FETs which do not have such a configuration, such as transmission gates and cascode circuits.

A semiconductor device, such as a field effect transistor (FET) or a MOSFET, can be fabricated on a bulk semiconductor substrate or on a silicon-on-insulator (SOI) substrate. The FET (or other device) may have a gate that protrudes above the surface of the substrate to define a raised gate. The gate overlies a channel extending between the source and drain and controls the flow of current between the source and drain regions.

A finFET is a term that generally refers to a FET device that has a thin silicon "fin", which forms the body of the device. The basic electrical layout and the mode of operation of a FinFET does not differ from a traditional field effect transistor. There is a source, a drain, and a gate. In contrast to planar MOSFETs, the channel between source and drain of a finFET is built as a three dimensional bar on top of the silicon substrate, called fin. The gate electrode is then wrapped around the channel, so that there can be formed several gate electrodes on each side which leads to reduced leakage effects and an enhanced drive current.

In forming a gate for a semiconductor device, a dummy gate is formed on the substrate. The dummy gate is then removed and replaced by an electrically conductive metal-containing gate (a replacement metal gate (RMG)). An inter-layer dielectric (ILD) may be used to cover the source and drain while removing the dummy gate structure. The ILD is then subjected to a chemical-mechanical polish (CMP). Difficulties may arise if the semiconductor device has a gate with a high aspect ratio. Such a gate can result from complementary metal-oxide-semiconductor (CMOS) scaling, where the gate length is shortened, thus raising the aspect ratio. In general, gates with high aspect ratios can present difficulties when combined with RMG techniques. However, a gate with a low aspect ratio can suffer from undesirable levels of resistance and potential discontinuation of the gate.

The present invention will now be described in detail with reference to the Figures. To simplify the disclosure, exemplary embodiments will refer to finFET devices and methods of creating the same. However, this is not to be interpreted as a limitation of the disclosure to only finFET devices.

In exemplary embodiments of the present invention, a semiconductor device (such as a field effect transistor (FET)), having high aspect ratio gate, is fabricated on a bulk semi-conductor substrate or on a silicon-on-insulator (SOI) layer. A dummy gate structure is employed during the fabrication of the semiconductor device to allow for the epitaxial growth of the source/drain regions. After the process of replacing the dummy gate structure with a replacement metal gate (RMG), an additional layer of metal is selectively deposited onto the RMG of the semiconductor device.

Figure 1B:
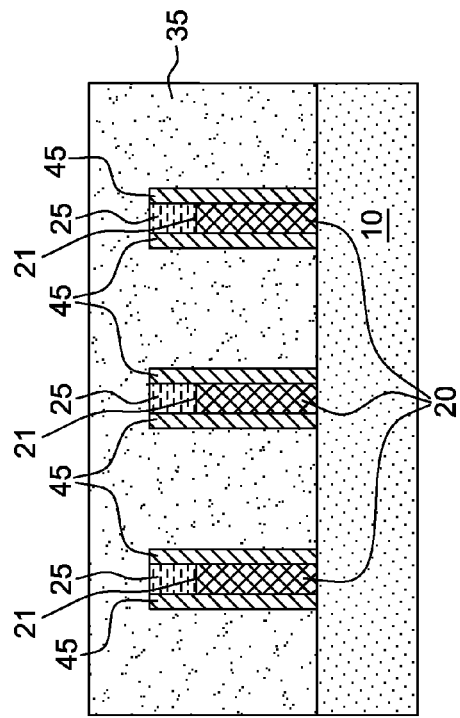
FIG. 1B is a cross sectional view, illustrating a tri-gate finFET device pre polycrystalline silicon removal, in accordance with an exemplary embodiment of the present invention.
Figure 1:
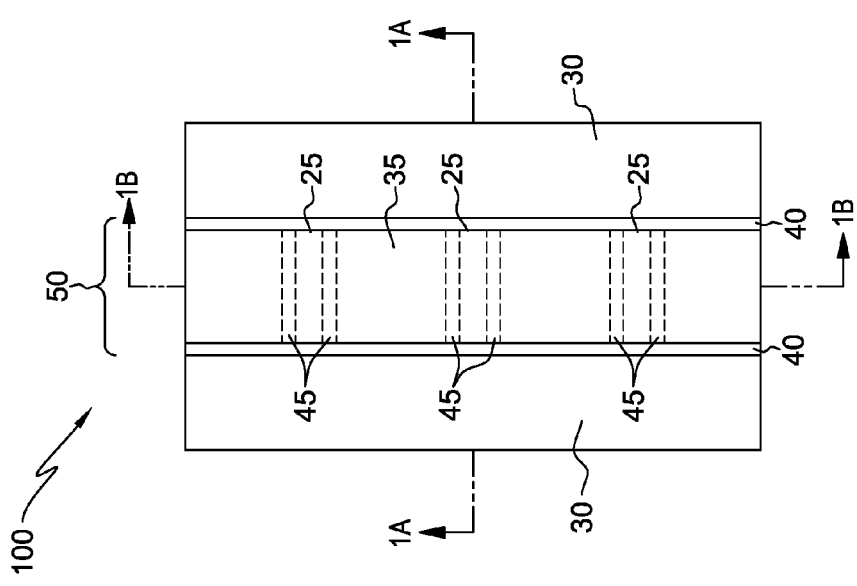
FIG. 1 is a top plan view, illustrating a tri-gate finFET device pre polycrystalline silicon removal, in accordance with an exemplary embodiment of the present invention.

FIG. 1 is a top plan view illustrating a tri-gate finFET device, 100, pre polycrystalline silicon removal, in accordance with one embodiment of the present invention.

Tri-gate finFET device 100 illustrates a high aspect ratio gate channel 50 that is filled with polycrystalline silicon (PC) 35. In an exemplary embodiment, a high aspect ratio is an aspect ratio that exceeds, for example, 10:1, 9:1, or 11:1. The location of gate channel 50 is indicated by an open brace symbol in FIGS. 1-4, gate channel 50 is not shown in FIGS. 5-6 but still exists. The side walls of gate channel 50 are, in general, substantially vertical and lined with layers of, for example, silicon nitride, herein denoted as spacer 40, which separates inter-layer dielectric (IDL) 30 from gate channel 50. In other words, respective spacer 40 run substantially parallel to, and has a substantially similar thickness along the length of, further respective ILD 30, see FIG. 1. Typically, spacer 40 is coplanar to IDL 30, i.e., spacer 40 is the same height as IDL 30 as seen in FIG. 1A, where spacer 40 and ILD 30 can be seen to abut and extend away from buried oxide (BOx) 10 to substantially the same distance.

In general, the height of gate channel 50 is defined by the height of spacer 40 located on the respective opposite side walls of channel 50. In FIG. 1, the location of three FIN 20 are denoted by the location of hard mask 25, which covers the three FIN 20. Hard mask 25 is visible through fill material 35, which is shown as semi-transparent in the top view. In general FIN 20 span the width of gate channel 50 to form a connection between the source and gate of the finFET. A layer of hard mask 20 is attached to, and covers, the top of each of the respective FIN 20. The number of FIN 20 included in channel 50 can vary in other embodiments.

A cross sectional view taken about the line 1A-1A further illustrates the layout of finFET device 100. In the view, fill material 35 is shown on top of hard mask 25, which is typically silicon nitride, that is further located on top of FIN 20. The spacer layers can be seen abutting BOx 10. The height of the spacer layers, and thus gate channel 50, are herein defined as the distance from BOx 10 to distal end (41) of the spacer layer, which can be seen in FIGS. 1A, 2A, 3A, 4A, 5A and 6A. The location of spacer 40 is shown as extending from the top of fill material 35 down to the bottom of FIN 20. Spacer 40 can therefore be seen as constituting a continuous layer along the length and height of channel 50. A layer of ILD 30 is located on each respective side of channel 50 with a EPI layer 15 including epitaxy (EPI) merged FINs located beneath the respective layers of ILD 30.

EPI layer 15 respectively constitutes the respective source layer and drain layer, connected by FIN 20, of finFET 100. As seen in FIG. 1A, the bottom surfaces of EPI layer 15, spacer 40, and FIN 20 are all respectively located on top of a layer of buried oxide (BOx) 10. As seen in finFET 100, spacer 40 and FIN 20 abut BOx 10 and form layers that extend perpendicularly from BOx 10. In general, in this embodiment, BOx 10 is located on top of a layer of base silicon, which is not shown, according to silicon on insulator (SOI) based technology. In other embodiments, the substrate can be a silicon on sapphire (SOS) substrate.

A cross sectional view, FIG. 1B, taken about the line 1B-1B further illustrates the layout of finFET device 100. In the view, fill material 35 is shown as a top layer, typically of polycrystalline silicon, that fills the spaces between the dummy gates. In general, the dummy gates herein are defined as respectively including dummy gate oxide 45, which is typically silicon nitride, hard mask 25, and FIN 20. As before, a layer of buried oxide (BOx) 30 composes the bottom layer.

Figure 2B:
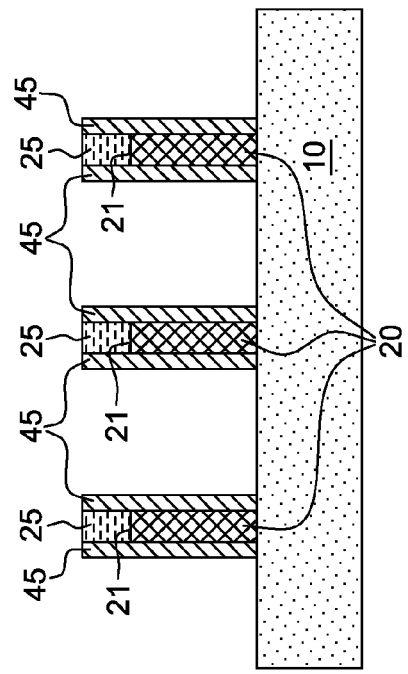
FIG. 2B is a cross sectional view, illustrating a tri-gate finFET device post polycrystalline silicon removal, in accordance with an embodiment of the present invention.
Figure 2A:
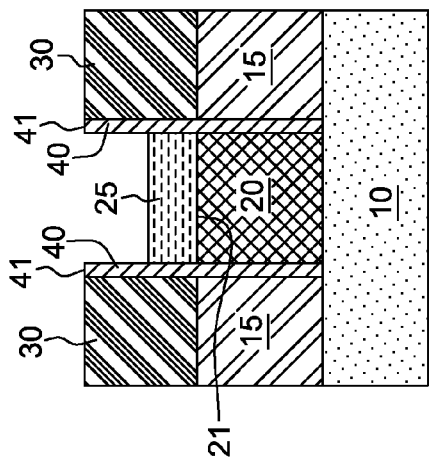
FIG. 2A is a cross sectional view, illustrating a tri-gate finFET device post polycrystalline silicon removal, in accordance with an embodiment of the present invention.
Figure 2:
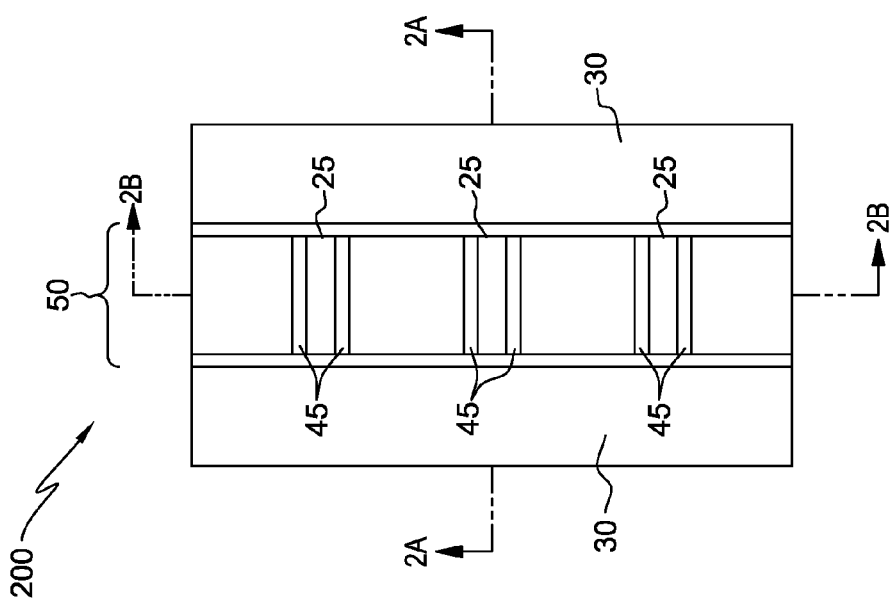
FIG. 2 is a top plan view, illustrating a tri-gate finFET device post polycrystalline silicon removal, in accordance with an embodiment of the present invention.

FIG. 2 is a top plan view illustrating a tri-gate finFET device, 200, post polycrystalline silicon removal, in accordance with one embodiment of the present invention. In general, PC 35 is removed using any one of the known chemical etching processes, such as a plasma etch process. With the exception of PC 35, the elements included in finFET device 200 are substantially similar as those included in finFET device 100.

As in FIG. 1, FIG. 2 includes cross sectional views FIGS. 2A and 2B, taken about the respective lines 2A-2A, and 2B-2B. As in the top plan view, the only change from what was described above in FIG. 1 is that PC 35 is shown as removed.

Figure 3A:
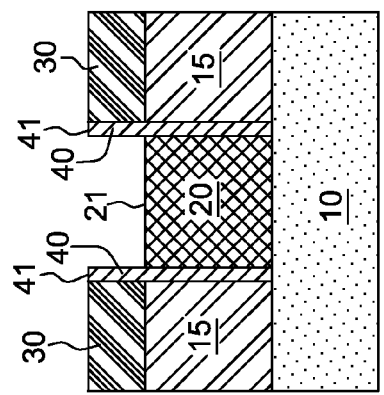
FIG. 3A is a cross sectional view, illustrating a tri-gate finFET device post removal of dummy gate oxide, hard mask, and chemical mechanical polishing, in accordance with an embodiment of the present invention.
Figure 3B:
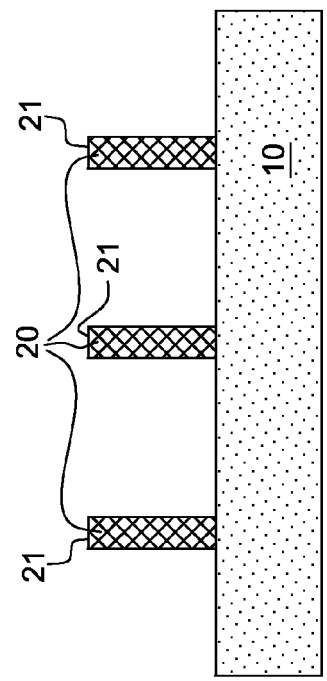
FIG. 3B is a cross sectional view, illustrating a tri-gate finFET device post removal of dummy gate oxide, hard mask, and chemical mechanical polishing, in accordance with an embodiment of the present invention.
Figure 3:
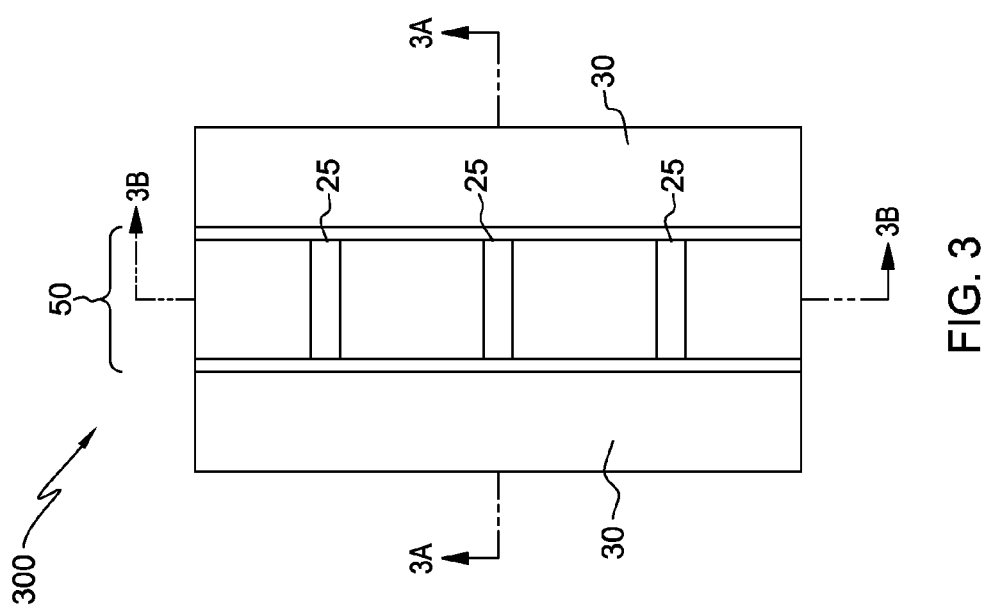
FIG. 3 is a top plan view, illustrating a tri-gate finFET device post removal of dummy gate oxide, hard mask, and chemical mechanical polishing, in accordance with an embodiment of the present invention.

FIG. 3 is a top plan view illustrating a tri-gate finFET device, 300, post etch removal of dummy gate oxide 45, hard mask 25, and chemical mechanical polishing (CMP), in accordance with one embodiment of the present invention. In general, dummy gate oxide 45 and hard mask 25 are removed using known etching processes. The application of CMP substantially reduces the height of ILD 30 and spacer 40. This reduction in the height of spacer 40 results in a reduction in the height of gate channel 50 to substantially near that of a FIN top surface 21 of FIN 20. It should be noted that in the known art, such a reduction in ILD 30, spacer 40, and gate channel 50 height is not advocated since such a reduction yields a lower aspect ratio and increases resistance and potential discontinuation of the gate. At this point, the filling of channel 50 using a RMG process would result in a gate that has what is generally considered unacceptable levels of resistance and a substantially increased risk of discontinuation of the resulting gate. The substantial change in ILD 30 and spacer 40 thickness can be seen when the height of ILD 30 and spacer 40 of FIG. 2 is compared to ILD 30 and spacer 40 of FIG. 3. The change in the respective height of ILD 30 and spacer 40 is further illustrated in the cross sectional view taken about the line 3A-3A. As depicted, the height of ILD 30 and spacer 40 has been reduced to a point where they are substantially near the height of FIN 20. The cross sectional view, FIG. 3B, taken about the line 3B-3B shows FIN 30 on top of BOx 10 with dummy gate oxide 45 and hard mask 25 removed.

In accordance with an exemplary embodiment, FIG. 4 is a top plan view, with two cross sectional views, illustrating a tri-gate finFET device, 400. A finFET device 400 is created when layers of high-k dielectric (HKD) 55, workfunction material (WFM) 60, and metal 65 are added onto a finFET device 300. HKD 55 can include materials such as hafnium oxide ($HfO_2$), hafnium silicates (HfSiOx), aluminum oxide ($Al_2O_3$), zirconium oxide ($ZrO_3$), lanthanum oxide ($La_2O_3$), as well as many additional classes of "high K" oxides. WFM 60, for n-type FETs, can include materials such as TiN, TiAl, TiAlN, TiAlNC, TaAlNC, HfSi, La, and TaN. For p-type FETs WFM 60 can include materials such as TiN, Ru, Cu, TaN, and TiAlN. Metal 65, also denoted as a first metal, can include low resistance materials and metals such as silver, copper, gold, aluminum, calcium, tungsten, and zinc.

In the top plan view, the layer of metal 65 is shown as semi-transparent to illustrate the location of FIN 20. In general, the layers of metal 65, HKD 55, WFM 60 cover the surface of finFET device 400. As such, the top plan view illustrates the form of FIN 20 and spacer 40, with ILD 30 not numbered but still existing. To simplify the illustration of FIG. 4, the layers of HKD 55 and WFM 60, which cover FIN 20, are not shown but still exist, for further details see cross section view taken about the line 4B-4B. As can be seen in the cross section views FIGS. 4A and 4B, taken about the respective lines 4A-4A and 4B-4B, the layers of HKD 55, and WFM 60 are typically thinner than the layer of metal 65. In general, metal 65 represents the bulk of the metal or material which fills the space between FIN 20.

In other embodiments, the composition of high-k dielectric (HKD) 55, work function metal (WFM) 60, and metal 65 can be any material or combination of materials which have the required characteristics to form a gate structure around FIN 20. Due to the reduced height of channel 50, metal 65 layer fills the space between two or more FIN 20 to a high degree of completion. The high degree of fill completion is further illustrated in the two cross sectional views respectively taken about the lines 4A-4A and 4B-4B.

Figure 5A:
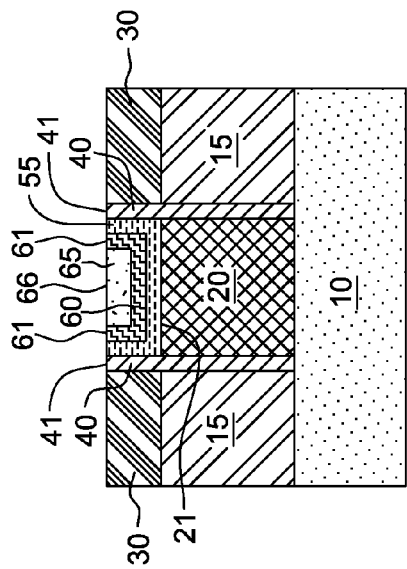
FIG. 5A is a cross sectional view, illustrating a tri-gate finFET device post height reduction of aluminum layer, in accordance with an exemplary embodiment of the present invention.
Figure 5B:
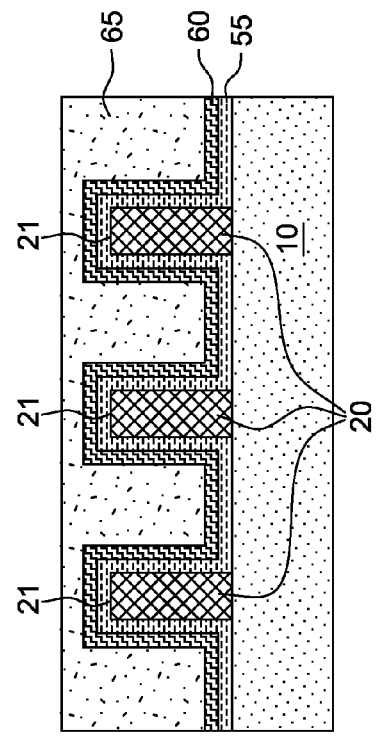
FIG. 5B is a cross sectional view, illustrating a tri-gate finFET device post height reduction of aluminum layer, in accordance with an exemplary embodiment of the present invention.
Figure 5:
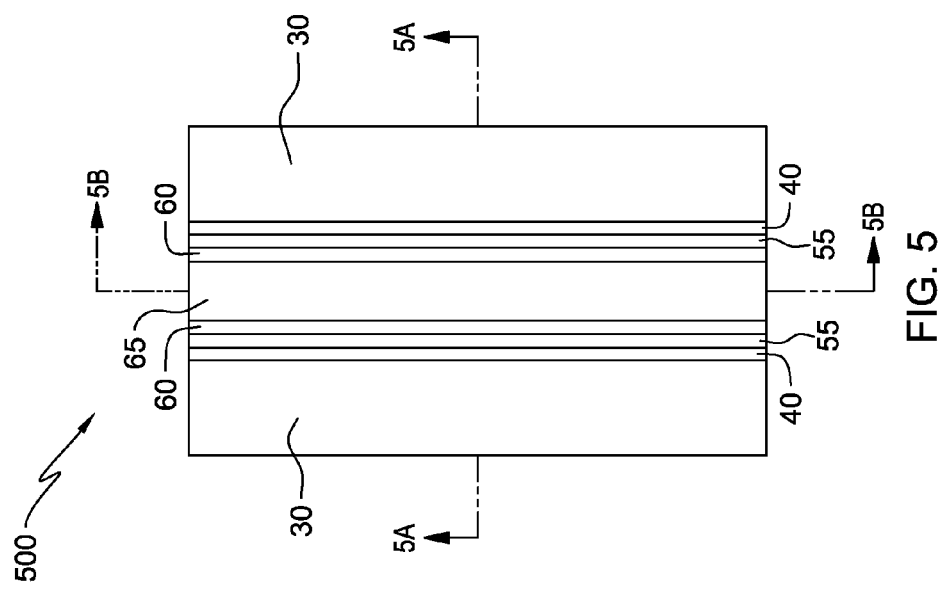
FIG. 5 is a top plan view, illustrating a tri-gate finFET device post height reduction of aluminum layer, in accordance with an exemplary embodiment of the present invention.

In accordance with an exemplary embodiment, FIG. 5 is a top plan view, with two cross sectional views, illustrating a tri-gate finFET device, 500. A finFET device 500 is created when metal 65 layer of a finFET device 400 is further reduced in height, typically using CMP. This further reduction in height of metal 65 layer is illustrated in the cross section views, FIGS. 5A and 5B, taken about the respective lines 5A-5A and 5B-5B (for further clarification regarding the reduction in height of metal 65 layer, compare FIG. 5A with FIG. 4A). In general, the reduction in height of metal 65 layer is a removal of excess material from metal 65 layer, WFM 60, HKD 55, spacer layers 40, and ILD 30 to create a uniform top surface. The top surface is composed of two WFM surface 61 and metal surface 66 and has a height substantially as that of spacer layers 40. As seen in the cross section views the height of metal 65 layer is substantially close in height to high-k dielectric (HKD) 55, and work function metal (WFM) 60. In this embodiment, due to the repeated reduction in gate height, the resulting gate has unacceptably high levels of resistance and increased potential for discontinuation.

In accordance with an exemplary embodiment, FIG. 6 is a top plan view, with two cross sectional views, illustrating a tri-gate finFET device, 600. A finFET device 600 is created when selective metal growth (SMG) is applied to add a layer of metal 70, on top of the surface composed of two WFM surface 61 and metal surface 66, see FIG. 6A. Metal 70, also denoted as a second metal, can include low resistance materials and metals such as silver, copper, gold, aluminum, calcium, tungsten, and zinc.

As can be seen in the cross section views, FIGS. 6A and 6B, taken about the respective lines 6A-6A and 6B-6B, metal 70 extends out to the edge of WFM 60 but does not pass HKD 55, which a design characteristic that can help reduce short circuits. The cross section views further illustrate the overall increase in gate height due to the addition of metal 70, which substantially reduces resistance and the potential for discontinuation of the gate. Thus, a gate is created with the space between respective FIN 20 being filled by metal 65 to a high degree of completion, while minimizing gate resistance and the potential for gate discontinuation.

Embodiments of the present invention may be used in a variety of electronic applications, including but not limited to advanced sensors, memory/data storage, semiconductors, microprocessors and other applications.

A resulting integrated circuit chip can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Having described the preferred embodiment of creating highly scaled finFET devices (which are intended to be illustrative and not limiting), it is noted that modifications and variations may be made by persons skilled in the art in light of the above teachings.

Resulting integrated circuit chips that incorporate one or more scaled finFET devices can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description. A reference to an element in the singular is not intended to mean "one and only one" unless specifically stated, but rather "one or more." All structural and functional equivalents to the elements of the various embodiments described throughout this disclosure that are known or later come to be known to those of ordinary skill in the art are expressly incorporated herein by reference and intended to be encompassed by the invention. It is therefore to be understood that changes may be made in the particular embodiments disclosed which are within the scope of the present invention as outlined by the appended claims.

Each respective figure, in addition to illustrating the structure of the present invention at various stages, also illustrates the respective steps of the method for the fabrication/manufacture of highly scaled finFET devices.

What is claimed is:

1. A method of fabricating a FET semiconductor device, the method comprising:
    forming a structure on top of a substrate, the structure including a gate channel that perpendicularly crosses over one or more FINs and is filled with a dummy gate material; and spacer layers that line, at least in part, sidewalls of the gate channel and abut the substrate, the spacer layers having a height from the substrate to a distal end of the spacer layer, the gate channel having a height being the same as that of the spacer layers;
    removing the dummy gate material;
    reducing the height of the gate channel to substantially near a top surface of the one or more FINs inside the gate channel;
    depositing a layer of high-k material into the gate channel;
    depositing a layer of first metal into the gate channel, wherein the layer of first metal covers, at least in part, the layer of high-k material, and the layer of first metal fills the gate channel;

removing excess material of said high-k material and said first metal to create a surface having a height substantially the same as that of said spacer layers; and selectively depositing a layer of second metal on top of said surface directly onto a remaining portion of said first metal, wherein the layer of second metal and the layer of first metal form a continued gate conductor with a high aspect ratio.

2. The method of claim 1, wherein the layer of first metal fills the gate channel substantially to the height of the spacer layers.

3. The method of claim 1, wherein the FET device further includes a layer which includes a source and a drain that are covered by a layer of inter layer dielectric, the gate channel being located between the source and the drain.

4. The method of claim 3, wherein a height of the layer of inter layer dielectric is substantially the same as the height of the gate channel.

5. The method of claim 3, wherein the layer which includes the source and the drain constitutes a merged source and drain epitaxial layer.

6. The method of claim 4, the method further including:
reducing the height of the layer of inter layer dielectric to be substantially the same as the height of the spacer layers.

7. The method of claim 1, wherein the step of reducing the height of the gate channel to substantially near the one or more FINs included in the gate channel includes reducing the height of the spacer layers.

8. The method of claim 1, the method further including the step of:
depositing, following the step of depositing the layer of high-k material, a layer of work-function material on top of the layer of high-k material.

9. The method of claim 8, wherein the work-function material includes at least one selected from a group consisting of TiN, TiAl, TiAlN, TiAlNC, TaAlNC, HfSi, La, TaN, Ru, and Cu.

10. The method of claim 1, wherein the high-k material includes at least one selected from a group consisting of hafnium oxide ($HfO_2$), hafnium silicates (HfSiOx), aluminum oxide ($Al_2O_3$), zirconium oxide ($ZrO_3$), and lanthanum oxide ($La_2O_3$).

11. The method of claim 1, wherein one or both of the layer of first metal and the layer of second metal include at least one selected from a group consisting of silver, copper, gold, aluminum, calcium, tungsten, and zinc.

12. A method of fabricating a FET semiconductor device, the method comprising:
forming a structure on top of a substrate, the structure including a gate channel that includes one or more FINs and is filled with a dummy gate material; at least one spacer layer that lines at least one sidewall of the gate channel and abuts the substrate, the spacer layer having a height measured from the substrate to a distal end of the spacer layer, wherein the height of the spacer layer is substantially equal to a height of the gate channel;

removing the dummy gate material;

reducing the height of the gate channel to substantially near a top surface of the one or more FINs included in the gate channel;

lining the gate channel with a layer of high-k material;

lining the gate channel with a layer of first metal, the layer of first metal covering the layer of high-k material and fills the gate channel;

removing excess material from the layer of first metal to create a surface; and selectively depositing a layer of second metal on top of the surface, wherein the layer of second metal and the layer of first metal form a continued gate conductor with a high aspect ratio.

13. The method of claim 12, wherein the layer of first metal fills the gate channel substantially to the height of the spacer layers.

14. The method of claim 12, wherein the FET device further includes a merged source and drain epitaxial layer that is covered by a layer of inter layer dielectric.

15. The method of claim 1, the method further including the step of:
lining the gate channel, following the step of lining the gate channel with a layer of high-k material, with a layer of work-function material.

* * * * *